(12) United States Patent
Cowens et al.

(10) Patent No.: US 7,276,401 B2
(45) Date of Patent: Oct. 2, 2007

(54) ADHESION BY PLASMA CONDITIONING OF SEMICONDUCTOR CHIP SURFACES

(75) Inventors: Marvin W. Cowens, Plano, TX (US); Masood Murtuza, Sugarland, TX (US); Vinu Yamunan, Dallas, TX (US); Charles Odegard, McKinney, TX (US); Phillip R. Coffman, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/580,751

(22) Filed: Oct. 16, 2006

(65) Prior Publication Data

US 2007/0128881 A1 Jun. 7, 2007

Related U.S. Application Data

(62) Division of application No. 11/118,196, filed on May 2, 2005, which is a division of application No. 11/047,519, filed on Feb. 1, 2005, which is a division of application No. 09/952,454, filed on Sep. 14, 2001, now Pat. No. 6,869,831.

(51) Int. Cl.
*H01L 21/00* (2006.01)
(52) U.S. Cl. .............................. 438/127; 257/E21.503
(58) Field of Classification Search .................. 438/109
See application file for complete search history.

(56) References Cited

U.S. PATENT DOCUMENTS

| | | | |
|---|---|---|---|
| 4,894,115 A | 1/1990 | Eichelberger et al. | 156/643 |
| 5,535,101 A | 7/1996 | Miles et al. | 367/808 |
| 5,631,498 A | 5/1997 | Anschel et al. | 257/690 |
| 5,729,896 A | 3/1998 | Dalal et al. | 29/840 |
| 5,731,243 A | 3/1998 | Feng et al. | 438/612 |
| 5,753,536 A * | 5/1998 | Sugiyama et al. | 438/108 |
| 5,882,433 A | 3/1999 | Linn et al. | 134/1.1 |
| 5,976,710 A | 11/1999 | Sachdev et al. | 428/620 |
| 6,074,895 A | 6/2000 | Dery et al. | 438/108 |
| 6,099,959 A | 8/2000 | Konrad et al. | 428/336 |
| 6,191,952 B1 | 2/2001 | Jimarez et al. | 261/771 |
| 6,200,888 B1 | 3/2001 | Ito et al. | 438/597 |
| 6,204,089 B1 | 3/2001 | Wang | 438/108 |
| 6,208,525 B1 | 3/2001 | Imasu et al. | 361/783 |
| 6,228,680 B1 | 5/2001 | Thomas | 438/108 |
| 6,249,039 B1 | 6/2001 | Harvey et al. | 257/531 |
| 6,294,405 B1 | 9/2001 | Higgins, III | 438/108 |
| 6,297,131 B1 | 10/2001 | Yamada et al. | 438/464 |
| 6,320,155 B1 | 11/2001 | Barnett | 219/121.46 |
| 6,324,069 B1 | 11/2001 | Weber | 361/783 |
| 6,372,622 B1 | 4/2002 | Tan et al. | 438/612 |
| 6,391,762 B1 | 5/2002 | Gamota et al. | 438/618 |
| 6,407,459 B2 | 6/2002 | Kwon et al. | 257/780 |
| 6,498,074 B2 | 12/2002 | Siniaguine et al. | 438/460 |
| 6,929,974 B2 * | 8/2005 | Ding et al. | 438/106 |

* cited by examiner

*Primary Examiner*—David A. Zarneke
(74) *Attorney, Agent, or Firm*—Yingsheng Tung; Wade James Brady, III; Frederick J. Telecky, Jr.

(57) ABSTRACT

A plasma conditioning method of improving the adhesion between an integrated circuit chip, having active and passive surfaces, the active surface polymer-coated and having a plurality of electrical coupling members, and an insulating underfill material. The method comprises the steps of positioning a wafer having a plurality of integrated circuits, including the coupling members, in a vacuum chamber of a plasma apparatus so that the polymer-coated surface faces the plasma source. Next, a plasma is initiated; the ion mean free path is controlled so that the ions reach the wafer surface with predetermined energy. The wafer surface is then exposed to the plasma for a length of time sufficient to roughen the polymer surface, clean the polymer surface from organic contamination and improve the surface affinity to adhesion. The adhesion ability of this surface to organic underfill material is thus enhanced.

10 Claims, 6 Drawing Sheets

ADHESION BY PLASMA CONDITIONING OF SEMICONDUCTOR CHIP SURFACES

This application is a division of Ser. No. 11/118,196, filed May 2, 2005, which is a division of Ser. No. 11/047,519, filed Feb. 1, 2005, which is a division of Ser. No. 09/952,454, filed Sep. 14, 2001, now U.S. Pat. No. 6,869,831, from which priority is claimed under 35 U.S.C. 120.

FIELD OF THE INVENTION

The present invention is related in general to the field of electronic systems and semiconductor devices and more specifically to the field of flip-chip assembly with underfilling, in which strong adhesion is required between the underfilling material, the semiconductor chip and the substrate.

DESCRIPTION OF THE RELATED ART

In flip-chip assembly, the active surface of a semiconductor chip, including the integrated circuits, is connected face-down to the substrate by coupling members, usually solder balls attached, on one side, to the chip and, on the opposite side, to the substrate. These solder balls thus create a gap between chip and substrate.

Important aspects of the flip-chip assembly of semiconductor chips have been studied in the 1960's by IBM researchers and published in a series of papers (IBM Journal for Research and Development, vol. 13, pp. 226-296, May 1969). It was found that the mismatch of thermal expansion coefficients between the semiconductor chip (usually silicon) and the substrate (usually ceramic or laminated plastic) causes strain and resultant stress in the coupling members (usually solder balls) and their joints. In the subsequent so-called C-4 technology, IBM reduced these stresses by placing polymeric material in the gap between chip, substrate and solder balls and completely filling this gap.

Equipment for applying this underfill material, and processes for polymerizing and "curing" this material have been described, for example, in U.S. Pat. No. 6,213,347, issued Apr. 10, 2001 and U.S. Pat. No. 6,228,680, issued May 8, 2001 (Thomas, "Low Stress Method and Apparatus for Underfilling Flip-chip Electronic Devices"). A variety of underfill dispensing techniques is reviewed in "Emerging Trends Drive Evolution of Underfill Dispensing" (S. J. Adamson, W. Walters, D. L. Gibson, and S. Q. Ness, Advanced Packaging vol. 9, No. 6, June 2000).

The problem of reliable adhesion of the underfill material to the semiconductor chip and to the various substrates employed has not been addressed in known technology. On the other hand, in the late 1980's and early 1990's, efforts had been undertaken by the semiconductor industry as well as by the National Institute for Standards and Technology, to improve the quality and reliability of wire bonding. The challenge was to clean the aluminum bond pads of silicon integrated circuit (IC) chips from residues of photoresist, which was left on the pads from the prior window opening step. The gold ball of the wires was then able to form uniform gold/aluminum intermetallics. The cleaning method investigated consisted of an exposure of the silicon wafer to a plasma capable of sputtering away the photoresist residues ("ashing"). A related technique is discussed in U.S. Pat. No. 5,731,243, issued May 24, 1998 (Peng et al., "Method of Cleaning Residue on a Semiconductor Wafer Bonding Pad").

In known technology, no effort has been undertaken to investigate similar cleaning methods to non-metallic surfaces, especially with the goal of improving the contact quality to metallic or non-metallic materials. An urgent need has, therefore, arisen for a coherent, low-cost method of enhancing adhesion between semiconductor-to-polymeric and polymeric-to-polymeric surfaces. When applied to semiconductor devices, the method should provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes a plasma conditioning method of improving the adhesion between an integrated circuit chip, having active and passive surfaces, the active surface polymer-coated and having a plurality of electrical coupling members, and an insulating underfill material. The method comprises the steps of positioning a wafer having a plurality of integrated circuits, including the coupling members, in a vacuum chamber of a plasma apparatus so that the polymer-coated surface faces the plasma source. Next, a plasma is initiated; the ion mean free path is controlled so that the ions reach the wafer surface with predetermined energy. The wafer surface is then exposed to the plasma for a length of time sufficient to roughen the polymer surface, clean the polymer surface from organic contamination and improve the surface affinity to adhesion. The adhesion ability of this surface to organic underfill material is thus enhanced.

Acceptable adhesion improvement is also obtained when the plasma conditioning process is performed on wafers prior to attaching the coupling members to the ICs. In this case, the roughening of the polymer-coated surface is slightly less.

In the first embodiment, the polymer coat consists of polyimide; in the second embodiment, the coat is polybenzoxasole. The plasma may be formed in an oxygen/argon mixture, or in an oxygen/nitrogen mixture.

The effect of the plasma conditioning results in a mechanical roughening of the polymer coat surface, as clearly visible in microscopic examination; further in a cleaning of that surface, especially from organic contamination, as clearly measured by the contact angle of a water drop on the surface. In addition, the polymer coat surface chemistry is modified and the surface energy increased. Together, these combined effects provide an improved adhesion capability of the polymer coat surface for underfill material, which is employed after flip-chip assembly of the semiconductor chip.

The improved adhesion between polymer-coated semiconductor chip and underfill material is demonstrated by a test, in which a force is applied the device from the outside in an effort to break the flip-assembled chip from its substrate. As the test results show, in the plasma-conditioned devices it is the substrate which breaks rather than the interface between the polymer-coated chip and the underfill, or the interface between the underfill and the substrate.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 2A depicts a screen printed solder bump.

FIG. 2B depicts a plated solder bump over plated copper bump.

FIG. 4A indicates the polymer surface before the process of plasma conditioning.

FIG. 4B indicates the polymer surface after the process of plasma conditioning.

FIG. 5A is a microphotograph taken at medium bump density, position A in FIG. 3.

FIG. 5B is a microphotograph taken at high bump density, position B in FIG. 3.

FIG. 5C is a microphotograph taken at low bump density, position C in FIG. 3.

FIG. 6A is a microphotograph taken after 12 min of plasma conditioning.

FIG. 6B is a microphotograph taken after 14 min of plasma conditioning.

FIG. 6C is a microphotograph taken after 16 min of plasma conditioning.

FIG. 7A applies for the ester type of the polyimide.

FIG. 7B applies for the ionic type of the polyimide.

FIGS. 9 to 11 are schematic cross sections of various plasma apparatus suitable for the plasma conditioning of semiconductor wafers according to the invention.

FIG. 9 refers to a reactive ion etch asher.

FIG. 10 refers an inductively coupled plasma asher.

FIG. 11A is a cross section perpendicular to the barrel axis, allowing a top view of a wafer.

FIG. 11B is a cross section along the barrel axis, allowing a cross section of the wafers.

DETAILED DESCRIPTION OF THE PREFERRED EMBODIMENTS

The present invention is related to U.S. Pat. No. 6,213,347, issued Apr. 10, 2001 (Thomas, "Low Stress Method and Apparatus of Underfilling Flip-chip Electronic Devices"), and U.S. Pat. No. 6,228,680, issued May 8, 2001 (Thomas, "Low Stress Method and Apparatus for Underfilling Flip-chip Electronic Devices").

Figure 1:
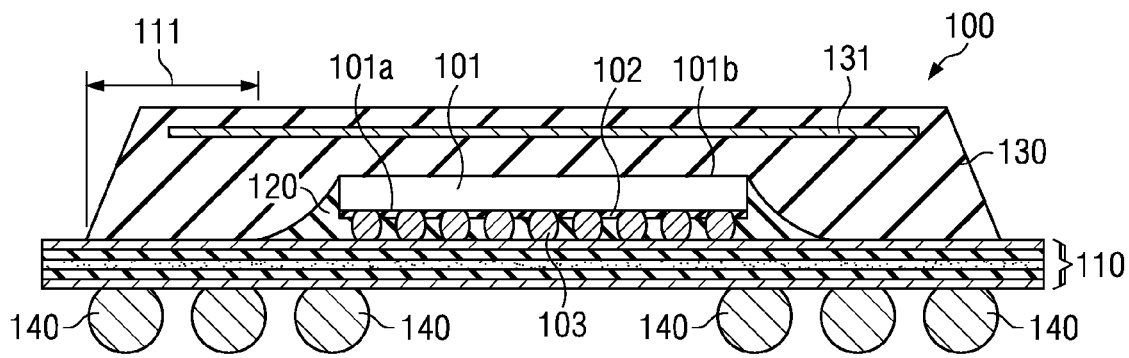
FIG. 1 is a schematic cross section of a ball grid array type semiconductor device having a flip-chip assembled chip and an underfill material, illustrating the field of the present invention.

FIG. 1 is an example for the semiconductor device types, for which the present invention is extremely useful. FIG. 1 is a schematic cross section of a ball grid array type semiconductor device, generally designated 100. The semiconductor chip 101 has an active surface 101a including the integrated circuit, and a passive surface 101b. The semiconductor chip 101 may be made of silicon, silicon germanium, gallium arsenide, or any other semiconductor material used in electronic device production.

Active surface 101a is covered with a polymer coat 102. This polymer coat may be made of polyimide (PIQ) or poly-benzoxasole (PBO) is preferably in the thickness range from about 2 to 8 µm. PIQ and PBO formulations are commercially available from Dow Corning, USA.

The active surface 101a further has a plurality of electrical coupling members 103. These coupling members may be solder bumps selected from a group consisting of tin/silver, indium, tin/indium, tin/bismuth, tin/lead, conductive adhesives, and solder-coated spheres. Preferably, they have a diameter from about 50 to 200 µm. The solder bumps may have various shapes, such as semispherical, half-dome, or truncated cone; the exact shape is a function of the deposition and reflow techniques and material composition.

In other devices, these coupling members may be bumps selected from a group consisting of gold, copper, copper alloy, or layered copper/nickel/palladium in the diameter range from 10 to 100 µm. Alternatively, the coupling members may consist of z-axis conductive epoxy. The bumps may have various shapes, for instance rectangular, square, round, or half-dome.

Figure 2A:
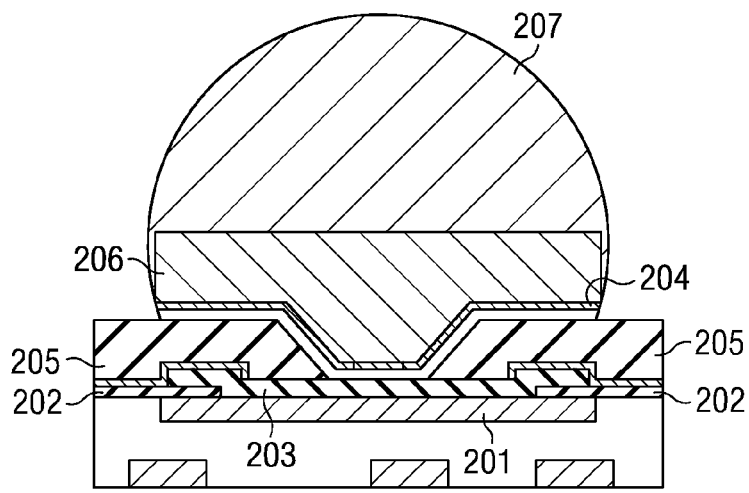
FIGS. 2A and 2B are schematic cross sections of a portion of the active, polymer-coated chip surface, with a coupling member attached, before the process of plasma conditioning according to the invention.
Figure 2B:
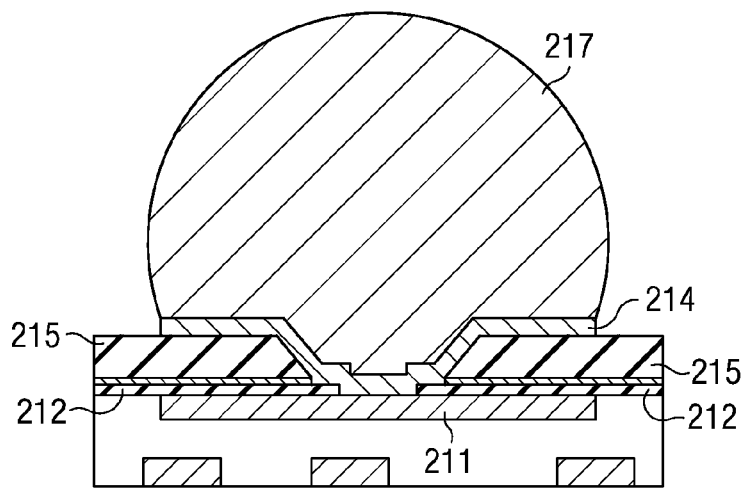

As examples of coupling members, FIGS. 2A and 2B illustrate two varieties of eutectic tin/lead solder bumps after solder reflow. As can be seen from the schematic cross section in FIG. 2A, which refers to IC copper metallization, the final interconnection copper layer 201 is covered by the protective overcoat 202 (typically silicon nitride), in which a window has been opened. A cover layer 203, which is metallurgically affine to the under-bump-metallization 204 and also adheres to copper, is positioned over copper layer 201. The polymer coat 205, in turn, is positioned over the cover layer 203 and has a window opened to allow contact with the under-bump-metallization 204. A relative thick copper bump 206 is plated before the deposition of the solder bump 207.

As can be seen from the schematic cross section in FIG. 2B, which refers to IC aluminum metallization, the final interconnection aluminum layer 211 is covered by the protective overcoat 212 (typically silicon nitride), in which a window has been opened. The polymer coat 215 is positioned over the protective overcoat layer 212; it has a window nested with the overcoat window. The under-bump-metallization 214 is contacting the aluminum through this window. The deposited eutectic solder is shown as bump 217 after reflow.

Referring now to FIG. 1. While the plasma conditioning process, described in more detail below, can be performed with good results on the polymer coat 102 before the coupling members 103 are attached, it is the preferred embodiment of the invention to perform the process after attaching the coupling members 103. In the latter case, the density of the bumps influence the results qualitatively and quantitatively. For the case that the coupling members are solder bumps, the preferred results are obtained with a center-to-center spacing of the solder bumps between about 100 and 500 µm.

Figure 3:
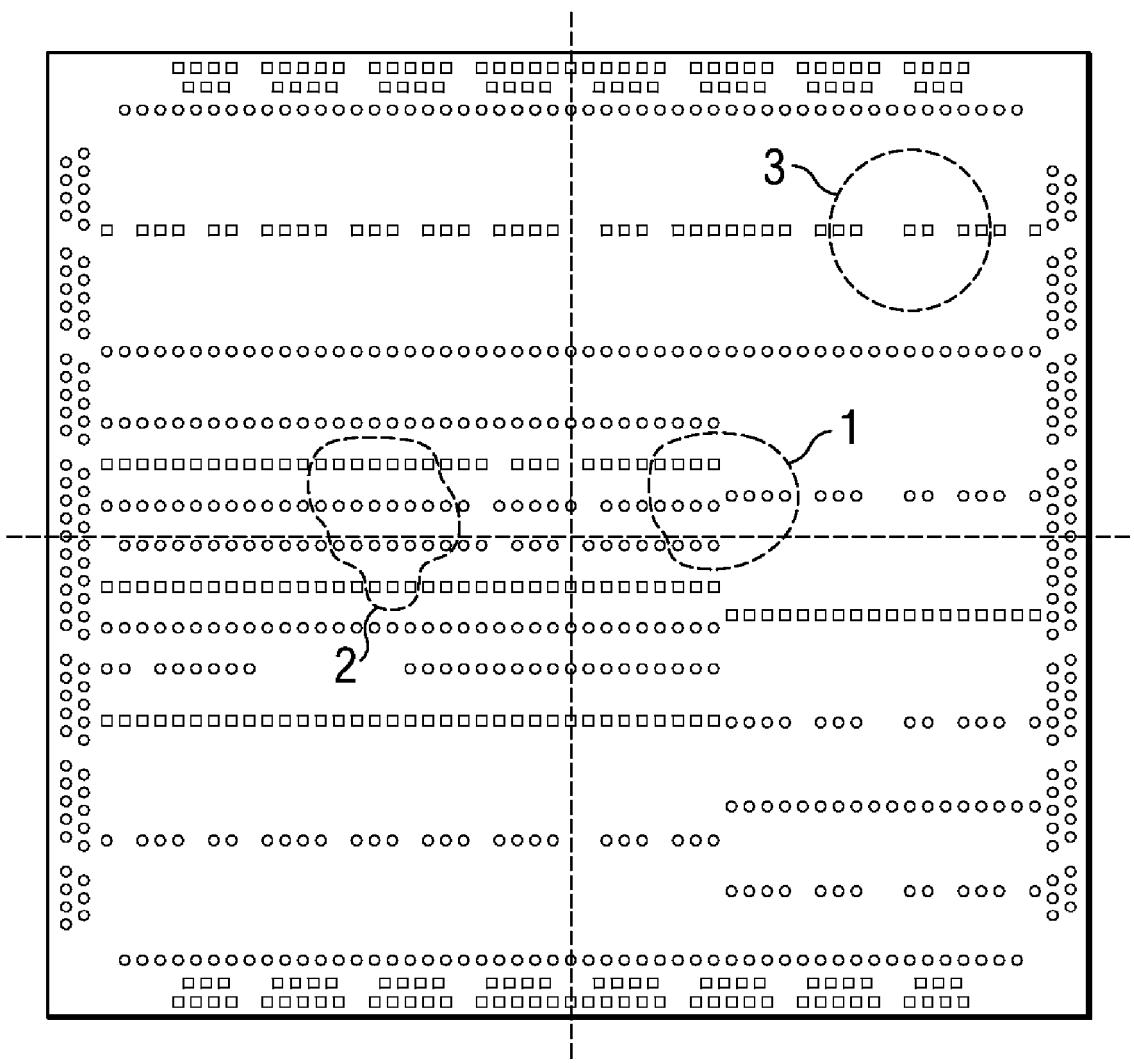
FIG. 3 is a schematic top view of an IC chip in order to indicate the bump layout with varying bump densities.

In many IC chips, the coupling member density varies significantly across the surface of the chip. An example is shown by the top view of FIG. 3. It depicts the actual solder bump distribution of a specific IC device. The average bump density in area 1 is medium, in area 2 high, and in area 3 low.

The plasma conditioning process described below is performed in wafer form. After completion of the plasma step, the chips are singulated from the wafer and assembled to the substrate. In FIG. 1, chip 101 and its coupling members 103 are depicted assembled, face down (flip-chip process), onto a two-metal-layer substrate 110. It should be pointed out, however, that the number of metal layers may vary widely, from 1 to 10 and more. Substrate 110 is made of electrically insulating materials such as polyimide, preferably in the thickness range from about 40 to 80 µm; in some instances, it may be thicker. Other suitable materials include Kapton™, Upilex™, PCB resin, FR-4 (which is an epoxy resin), or a cyanate ester resin (sometimes reinforced with a woven glass cloth). These materials are commercially available from several sources; as examples, in the U.S.A., companies include 3-M, DuPont, and Sheldahl; in Japan, Shinko, Shindo, Sumitomo, and Mitsui, and Ube Industries Ltd; and in Hong Kong, Compass.

In the face-down assembly process, the coupling members 103 form a gap between the polymer coat 102 and the substrate 110. After chip assembly, polymeric underfill material 120 is used to fill this gap. A preferred technique for apparatus and method for underfilling is described in U.S. Pat. No. 6,213,347, issued Apr. 10, 2001, and U.S. Pat. No. 6,228,680, issued May 8, 2001 (Thomas, "Low Stress Method and Apparatus for Underfilling Flip-chip Electronic Devices"). The preferred material for underfilling is an epoxy filled with boron nitride or with aluminum nitride; the epoxy is a bisphenol A with an anhydride cross-linking agent. Epoxy formulations are commercially available from Dexter, USA.

These underfill materials 120 adhere to both the polymer coat 102 and the substrate 110. After completing the plasma conditioning for polymer coat 102, the adhesion of underfill 120 to coat 102 and to substrate 110 is so strong that a force applied from outside breaks the substrate 110, rather than the interface between the underfill 120 and the polymer-coat 102, or the interface between the underfill 120 and the substrate 110.

The device in FIG. 1 further has encapsulation material 130, preferably applied by a transfer molding process. Encapsulation 130 protects the passive surface 101b of chip 101, and at least a portion 111 of substrate 110 not covered by the attached chip 101. Encapsulation material 130 may be polymerizable epoxy and thus endow stability and even rigidity to device 100. Embedded in encapsulation 130 may be a heat spreader 131.

In FIG. 1, a plurality of solder balls 140 are attached to substrate 110 opposite to the attached chip 101 and the encapsulation material 130. Solder balls 140 serve as ball grid array connections to printed wiring boards or electrical parts.

The plasma conditioning process of this invention is performed in wafer form, with the active wafer surface coated by the PIQ layer, or alternatively by the PBO layer. In the preferred embodiment, the plurality of electrical coupling members are attached to the active wafer surface before starting the plasma process. Alternatively, the coupling members are attached after the plasma conditioning. The results of the plasma conditioning are:

To roughen the PIQ, or PBO, surface;

to clean the PIQ, or PBO, surface from unwanted organic and inorganic contamination; and to improve the polymer surface affinity to adhesion.

All of these components contribute to the enhancement of the adhesion ability of the PIQ, or PBO, surface to the epoxy-based underfill material.

PIQ or PBO Surface Roughening

Figure 4A:
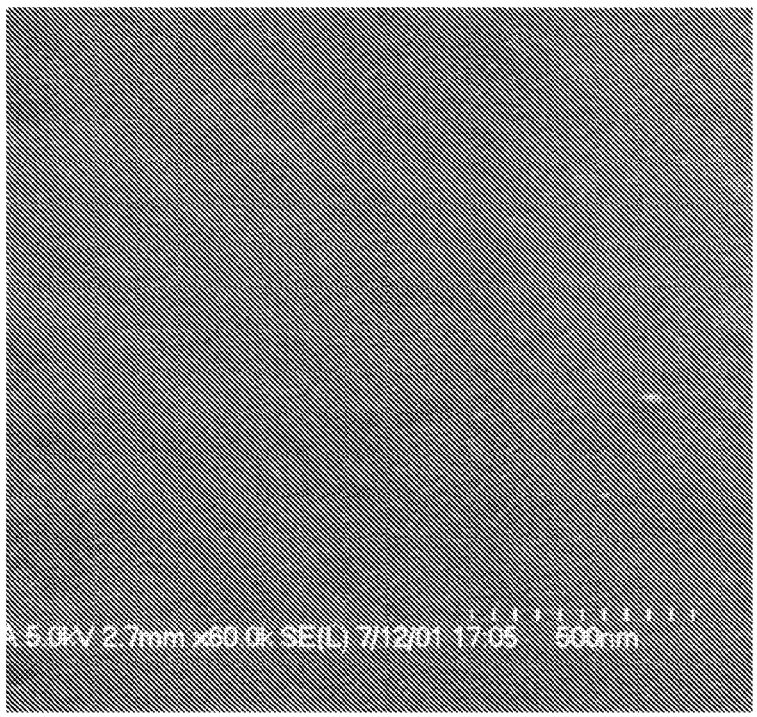
FIGS. 4A and 4B are microphotographs of a portion of the polymer coat over the active chip surface.

The most significant contribution to adhesion improvement is derived from the mechanical roughening of the PIQ, or PBO, surface. The microphotographs of FIG. 4 explain the reason. FIG. 4A is a photograph under 60,000× magnification of the PIQ surface before plasma conditioning. As can be seen, the surface appears smooth on that scale. Consequently, the adhesion of this PIQ surface to the underfill material is poor.

Figure 4B:
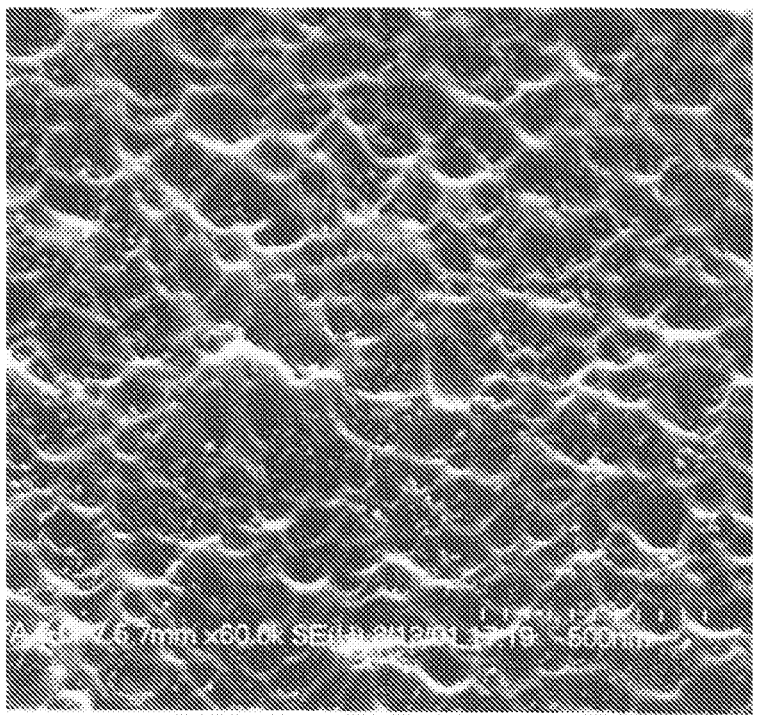

In contrast, FIG. 4B is a microphotograph under 60,000× magnification of the PIQ surface after plasma conditioning. As can be seen, the surface is rough. The peak-to-valley texture of this and following microphotographs is about 0.1 to 3% of the PIQ layer thickness. Consequently, the adhesion of this PIQ surface the underfill material is excellent.

Figure 5A:
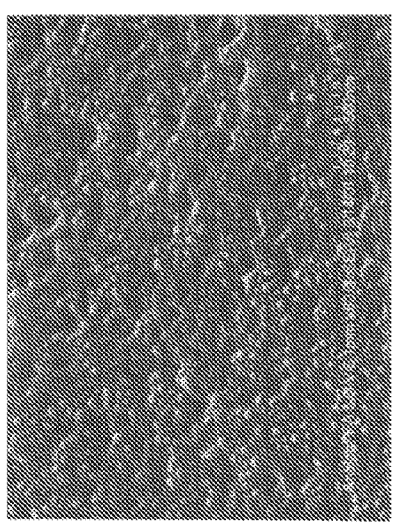
FIGS. 5A, 5B and 5C are microphotographs of portions of the polymer coat over the active chip surface after the process of plasma conditioning. The photographs are taken at various locations and various solder bump densities of the chip surface.
Figure 5B:
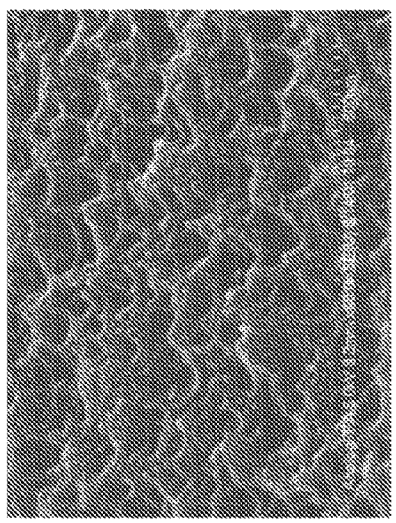
Figure 5C:
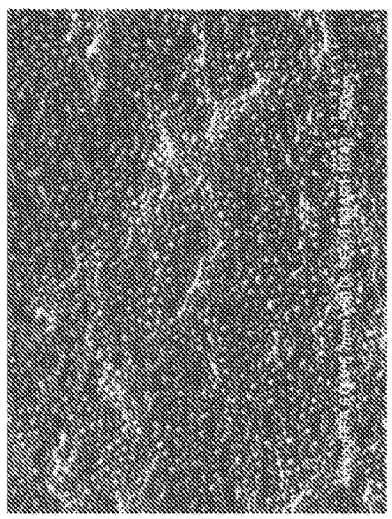

FIGS. 5A to 5C illustrate the effect of the solder bump density on the surface roughness of the PIQ surface achieved by plasma conditioning. In all photographs, the magnification of the PIQ surface is 60,000×. FIG. 5A demonstrates the PIQ after-plasma surface roughness in the proximity of a medium solder bump density (region 1 in FIG. 3). FIG. 5B shows the PIQ after-plasma surface roughness in the proximity of a high solder bump density (region 2 in FIG. 3). FIG. 5C shows the PIQ after-plasma surface roughness in the proximity of a low solder bump density (region 3 in FIG. 3). Although in every case significant surface texture can be achieved by the plasma, resulting in greatly improved adhesion to the underfill material, FIG. 5 clearly demonstrate the favorable influence of a high solder bump density for pronounced after-plasma surface roughness.

Figure 6A:
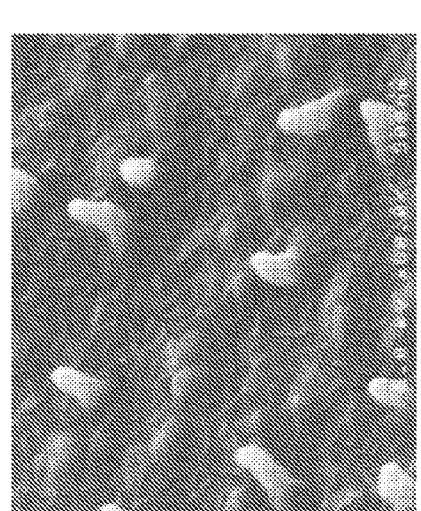
FIGS. 6A, 6B and 6C are microphotographs of portions of the polymer coat over the active chip surface after the process of plasma conditioning. The photographs are taken after various times of plasma conditioning.

Auger analysis of the plasma-conditioned PIQ or PBO surface has identified numerous tin or lead depositions in the neighborhood of tin/lead solder bumps. These depositions protect the PIQ or PBO material underneath from further plasma bombardment so that steep elevations of PIQ or PBO are created in a landscape eroded by the continued plasma bombardment. FIG. 6A illustrates an example of the resulting rough surface contour after 12 min plasma exposure in a bump-near area (60,000× magnification).

Figure 6B:
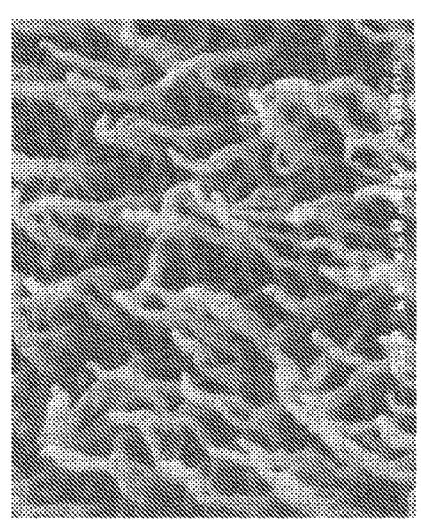

How steeply the continued plasma exposure may contour the polymer surface, when a high density of tin/lead depositions has been created around the bumps in the early phase of the bombardment, is depicted in the example of FIG. 6B (14 min plasma treatment). It is obvious that surfaces as rough as shown in FIG. 6B are especially suitable for strong adhesion to subsequent epoxy-based materials.

Figure 6C:
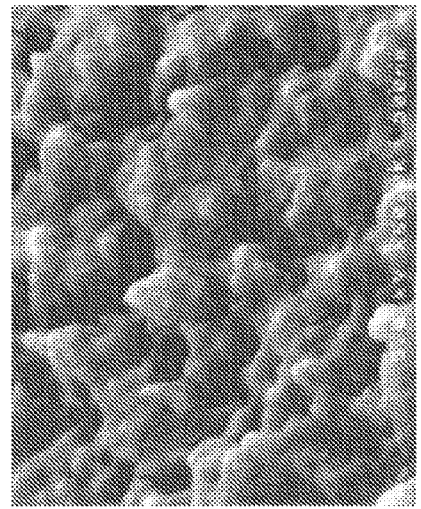

FIG. 6C shows another example of a rough surface created by tin/lead depositions of less concentration (plasma exposure 16 min). FIG. 6C resembles FIG. 5B. While adhesion will be extra strong in these examples, it should be repeated that even less pronounced surface contours like in FIG. 5C create favorable conditions for significantly improved coat-to-underfill adhesion.

PIQ or PBO Surface Cleaning

As mentioned above, photoresist residues, left over from process steps of opening contact windows, have caused problems in the late 1980's for creating reliable, reproducible gold-to-aluminum wire bonds. The experience gained in identifying these patchy, mechanically tough deposits by Auger analysis, can be employed to identify any photoresist left-overs from the window-opening process steps described in FIGS. 2A and 2B. The plasma parameters used for PIQ or PBO conditioning can then be adjusted to remove these contaminant reliably; see below for plasma process description.

A simple yet sensitive test for polymer surface cleanliness is the so-called water drop test. For clean surfaces, the contact angle of a water drop is significantly less than 10°. In contrast, film- or patch-contaminated surfaces often show contact angles of 30° or more.

PIQ or PBO Surface Affinity to Adhesion

Figure 7A:
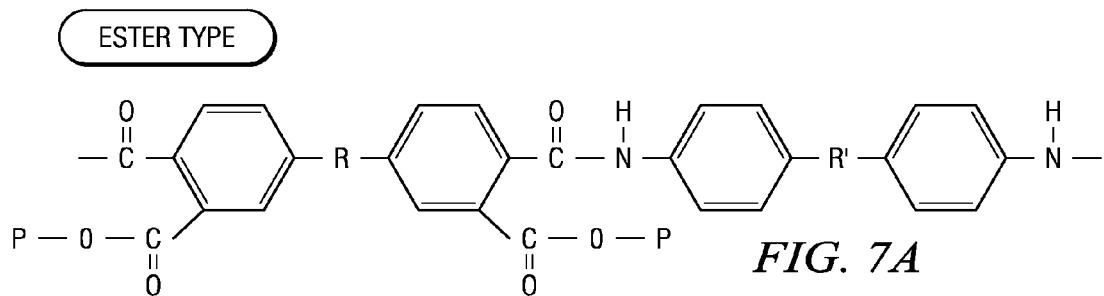
FIGS. 7A and 7B describe the structure of negative photosensitive polyimide in the first embodiment of the polymer coat over the active chip surface.
Figure 7B:
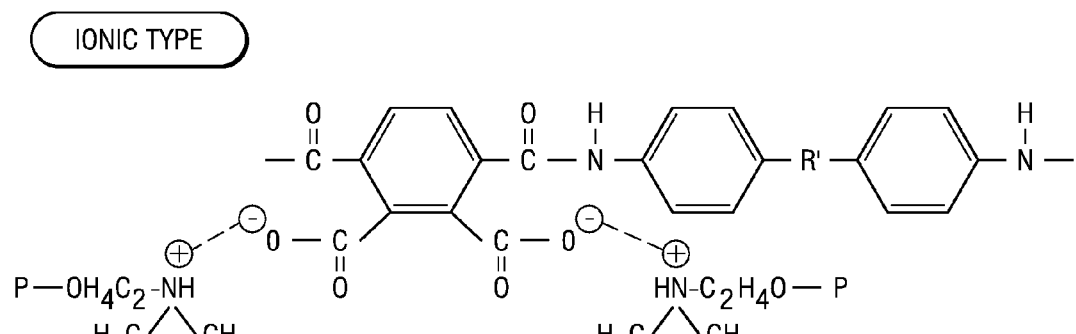

FIGS. 7A and 7B describe the structure of negative photosensitive polyimide in the first embodiment of the polymer coat over the active chip surface. FIG. 7A, applicable to the ester type of polyimide, shows the photoreactive group indicated by "P". Enhancing the number of "dangling bonds" and adhesion sites by the plasma conditioning contributes to the improved surface affinity to adhesion.

FIG. 7B, applicable to the ionic type of polyimide, shows the electrical charges involved in the locations of ionic binding. Here again, "P" indicates the photoreactive group. Enhancing the number of "dangling bonds" and adhesion sites by the plasma conditioning contributes to the improved surface affinity to adhesion.

Figure 8:
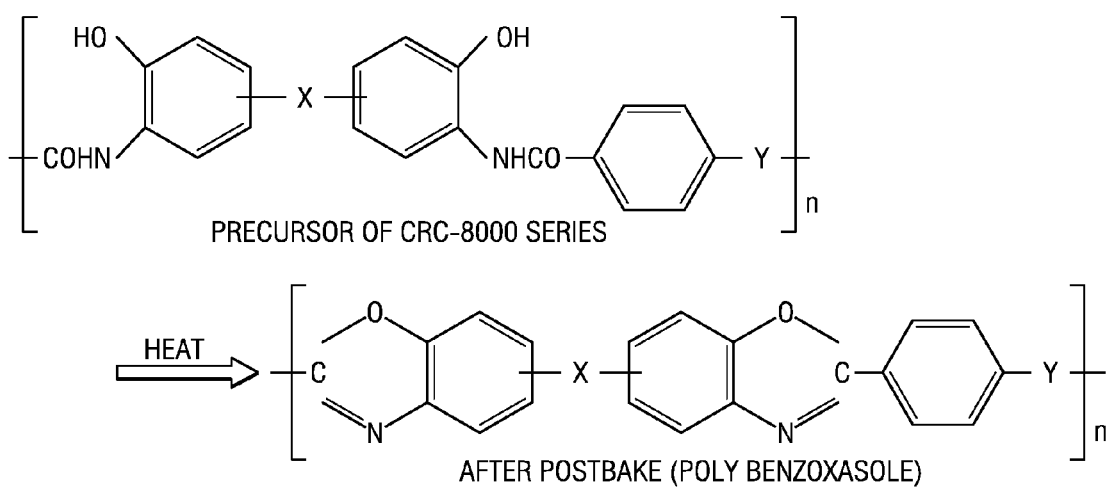
FIG. 8 describes the formation of poly-benzoxasol (PBO) in the second embodiment of the polymer coat over the active chip surface.

FIG. 8 describes the formation of poly-benzoxasol in the second embodiment of the polymer coat over the active chip surface. The formula shows the base polymer as the precursor of the CRC-8000 series. Heat treatment is then transforming the base polymer into poly-benzoxasole as the post-bake formulation of the polymer.

Figure 9:
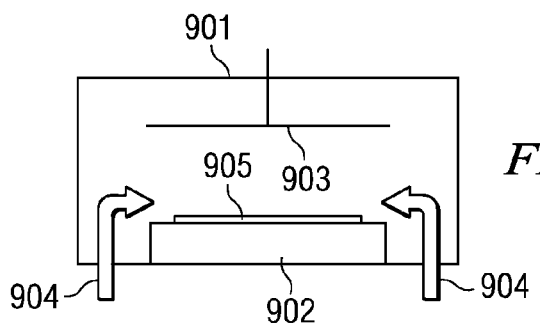
Figure 10:
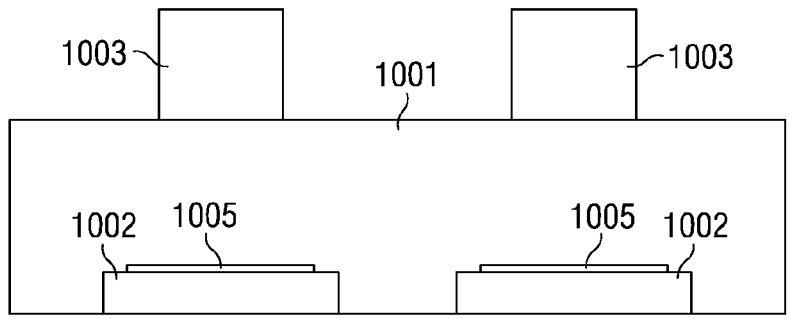

FIGS. 9 to 11 are schematic cross sections of a number of different plasma apparatus, and thus plasma processes, which are all suitable for the plasma conditioning of whole semiconductor wafers according to the present invention. It should be stressed that the plasma conditioning method of the present invention is equally successful for whole wafers before "sawing" into individual chips, or after singulation into individual chips. In the latter case, the plurality of chips remains still attached to the supporting tape (the so-called "blue tape" held within a sturdy frame).

The apparatus of FIG. 9 is referred to as a "reactive ion etch asher". In FIG. 9, inside the bell jar 901 are the pedestal 902 for the whole wafer 905 and the electrode 903. Pedestal 902 is a water cooled base plate, allowing temperature control of the wafer during plasma conditioning. Arrows 904 indicate the gas flow. The chamber size, given by bell jar 901, is typically 30 cm diameter and between 10 and 25 cm tall. The distance between the wafer 905 and the electrode 903 can vary from about 2 to 12 cm. The bias applied between wafer and electrode may vary from 300 to 450 V.

The plasma comprises a mixture of oxygen and argon, or of oxygen and nitrogen. For conditioning PIQ surfaces, the plasma is preferably controlled to a flow of 2000 to 3000 sccm (standard cubic centimeter) oxygen and 700 to 1200 sccm argon at a pressure of 2 to 3 Torr. The time of plasma exposure is preferably controlled to a period between 150 and 250 s, but longer time periods have also been employed successfully.

For conditioning PBO surfaces, the plasma is preferably controlled to a flow of 2000 to 3000 sccm oxygen and 800 to 1100 sccm argon at a pressure of 2 to 3 Torr. The time of plasma exposure is preferably controlled to a period between 130 and 200 s, but longer time periods have also been employed successfully.

The apparatus of FIG. 10 is referred to as a "inductively coupled plasma asher". In FIG. 10, inside the bell jar 1001 are one or more pedestals 1002 for the whole wafers 1005 and the plasma tubes 1003. Pedestals 1002 are cooled base plates, allowing temperature control of the wafers (for instance, to 60° C.) during plasma conditioning. The chamber size, given by bell jar 1001, is typically 90 by 40 cm, and between 10 to 15 cm tall. The plasma quartz tubes 1003 above chamber 1001 are typically 22 cm diameter and 12 cm long.

Figure 11A:
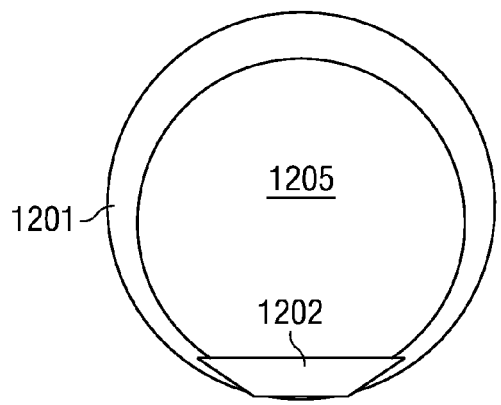
FIGS. 11A and 11B refer to a barrel asher.
Figure 11B:
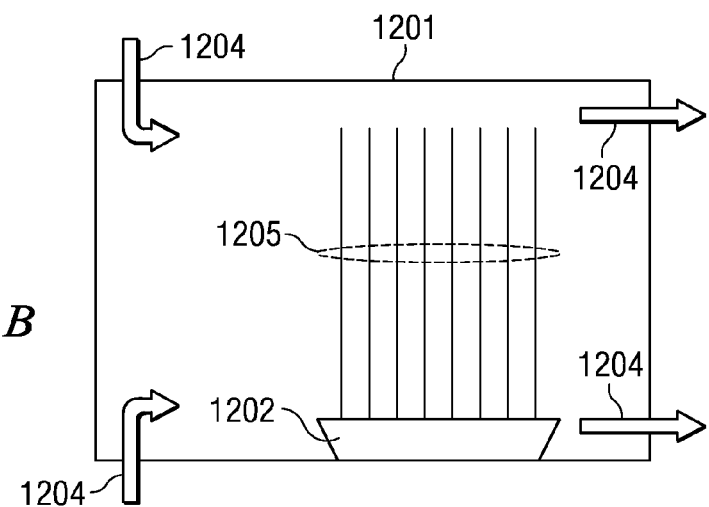

The apparatus of FIGS. 11A and 11B is referred to as a "barrel asher". In FIGS. 11A and 11B, inside the tube 1201 is a boat 1202 for a plurality of wafers 1205. Arrows 1204 indicate the gas flow. The chamber size, given by tube 1201, is typically 30 to 35 cm diameter and 30 to 35 cm length. Boat 1202 may contain 1 to 10 or more wafers. The plasma conditions are as described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of improving the adhesion between an integrated circuit chip, having active an surface, said active surface polymer-coated and an insulating underfill material, comprising the steps of:
    providing at least one integrated circuit chip, said at least one chip having a polymer-coated active surface;
    positioning said at least one chip in a vacuum chamber of a plasma apparatus so that said polymer-coated surface faces the plasma source;
    initiating a plasma and controlling the ion mean free path so that said ions reach said wafer surface with predetermined energy; and
    exposing said polymer-coated wafer surface to said plasma for a length of time sufficient to enhance the number of dangling bonds in said polymer coated surface to improve the surface affinity to adhesion to said insulating underfill material.

2. The method of claim 1 further including the steps of providing a substrate and a plurality of electrical coupling members, said coupling members forming a gap between said polymer coat and said substrate.

3. The method according to claim 1 wherein said plasma comprises a mixture of oxygen and argon or oxygen and nitrogen.

4. The method according to claim 1 wherein said plasma control and time exposure for polyimide (PIQ) consist of a flow of 2000 to 3000 sccm (standard cubic centimeter) oxygen and 700 to 1200 sccm argon at a pressure of 2 to 3 Torr and 150 to 250 s.

5. The method according to claim 1 wherein said plasma control and time exposure for poly-benoxasole (PBO) consist of a flow of 2000 to 3000 sccm oxygen and 800 to 1100 sccm argon at a pressure of 2 to 3 Torr and 130 to 200 s.

6. The method according to claim 1 wherein said roughened polymer surface shows a peak-to-valley texture of about 0.1 to 3% of the polymer thickness.

7. The method according to claim 1 wherein said cleaned polymer surface shows a water drop contact angle of less than 10°.

8. The method according to claim 1 wherein each said at least one chip has a passive surface, further comprising the steps of:

encapsulating, with a polymer compound, the passive surface of said chip and at least a portion of said substrate surface not covered by said attached chip, and attaching solder balls to said substrate surface opposite said chip and encapsulation material.

9. A method of improving the adhesion between an integrated circuit chip having active and passive surfaces, said active surface polymer-coated, and an insulating underfill material, comprising the steps of:

positioning a wafer having at least one integrated circuit in a vacuum chamber of a plasma apparatus so that said polymer-coated surface faces the plasma source;

initiating a plasma and controlling the ion mean free path so that said ions reach said wafer surface with predetermined energy; and exposing said wafer surface to said plasma for a length of time sufficient to enhance the number of dangling bonds in the polymer of said polymer-coated surface to improve the surface affinity to adhesion and to enhance the adhesion ability of said surface to said insulating underfill material.

10. The method according to claim 9 further comprising the steps of:

attaching a plurality of electrical coupling members to said active chip surface;

providing a substrate;

attaching the at least one chips to said substrate, spaced apart by a gap provided by said coupling members; and filling said gap between said coupling members, polymer coat and substrate with said polymeric underfill material adhering to said polymer coat and said substrate.

* * * * *